United States Patent [19]

Kiyama et al.

[11] Patent Number: 4,668,840
[45] Date of Patent: May 26, 1987

[54] PHOTOVOLTAIC DEVICE

[75] Inventors: Seiichi Kiyama; Hitoshi Kihara; Hideki Imai, all of Osaka, Japan

[73] Assignee: Sanyo Electric Co., Ltd., Japan

[21] Appl. No.: 749,888

[22] Filed: Jun. 27, 1985

[30] Foreign Application Priority Data

Jun. 29, 1984 [JP] Japan ............................. 59-135824
May 2, 1985 [JP] Japan ............................... 60-95131

[51] Int. Cl.[4] .............................................. H01L 27/14
[52] U.S. Cl. ..................................... 136/244; 29/572; 136/258
[58] Field of Search ......... 136/244, 249 MS, 258 AM

[56] References Cited

U.S. PATENT DOCUMENTS

| 4,243,432 | 1/1981 | Jordan et al. | 136/244 |
| 4,518,815 | 5/1985 | Yamazaki | 136/244 |
| 4,622,432 | 11/1986 | Yamazaki | 136/244 |

FOREIGN PATENT DOCUMENTS

| 59-35489 | 2/1984 | Japan | 136/258 AM |
| 59-35491 | 2/1984 | Japan | 136/258 AM |
| 59-103383 | 6/1984 | Japan | 136/258 AM |

Primary Examiner—Aaron Weisstuch
Attorney, Agent, or Firm—Darby & Darby

[57] ABSTRACT

A photovoltaic device comprises a plurality of photoelectric converting regions formed on an insulating surface of a light transmissive substrate. Each photoelectric converting region includes a transparent film electrode, an amorphous semiconductor portion having a PIN junction parallel to the film surface and a back film electrode connected to the transparent film electrode of an adjacent region of the insulating surface. On a portion of the transparent film electrode, there is formed an insulating adiabatic layer. The adiabatic layer is formed at a position where an energy beam to be irradiated in the production process. Accordingly, when the energy beam is irradiated and the back electrode film is divided corresponding to each photoelectric converting region, thermal damage to the transparent film electrode due to the energy beam is prevented by the insulating adiabatic layer.

13 Claims, 17 Drawing Figures

PHOTOVOLTAIC DEVICE

BACKGROUND OF THE INVENTION

1. Field of the Invention

The present invention relates to a photovoltaic device. More specifically, the present invention relates to a photovoltaic device such as a solar cell having, for example, an amorphous silicon derivative semiconductor photo-active layer.

2. Description of the Prior Art

FIG. 1 is a cross sectional view showing the fundamental construction of a conventional photovoltaic device in practical use. Such fundamental construction is shown, for example, in U.S. Pat. No. 4,281,208 assigned to the same assignee as the present invention. Transparent film electrodes 2a, 2b, 2c, —are formed on the surface of a substrate 1 having insulating and light transmissive properties, such as glass and heat-resistant plastic, etc corresponding to each photoelectric converting region 5a, 5b, 5c, —. The transparent film electrodes 2a, 2b, 2c, —are constituted by a transparent conductive oxide such as $SnO_2$, ITO, and the like, and serve as first film electrodes. On each transparent film electrode 2a, 2b, 2c, —, a photo-active layer 3a, 3b, 3c, —is formed, which consists of a filmy amorphous semiconductor including amorphous silicon, amorphous silicon carbide, amorphous silicon germanium, and microcrystals thereof. On each photo-active layer 3a, 3b, 3c, —, a back film electrode 4a, 4b, 4c, —is deposited, which consists of an ohmic metal such as aluminum or aluminum alloy. Each back film electrode 4a, 4b, 4c, —extends toward an exposed portion 2b', 2c', —of the adjacent transparent film electrode 2b, 2c, —and is electrically connected thereto. Accordingly, a plurality of photoelectric converting regions 5a, 5b, 5c, —constituted by the transparent film electrodes 2a, 2b, 2c, —and the back film electrodes 4a, 4b, 4c, —sandwiching the photo-active layers 3a, 3b, 3c, —are electrically connected in series.

The photo-active layers 3a, 3b, 3c, —include therein, for example, a PIN junction parallel to the film surface or junctions of multiple construction or, so called tandem construction, etc. When light is irradiated through the substrate 1 and the transparent film electrodes 2a, 2b, 2c, —, electromotive force is generated in each photoactive layer 3a, 3b, 3c, —, which is electrically added and outputted.

For manufacturing a photovoltaic device having such a configuration, there has recently been proposed to use a laser beam as disclosed, for example, in U.S. Pat. No. 4,292,092. One technique disclosed in the U.S. patent is to form the adjacent spacing portions between each photoelectric converting region 5a, 5b, 5c, —by burning off the electrode film with irradiation by a laser beam. The laser beam process is very effective in that very precise processing can be obtained without using wet processing as in the previous photo-etching technique.

When using the laser beam, since the laser processing is substantially a thermal processing, care must be taken not to damage a layer which may be under the layer being processed. That is, thermal damage to the lower layer which need not needed be processed must be avoided, so that it is not removed in addition to the layer being processed. In order to satisfy this requirement, the prior art mentioned above proposes optimum setting of the laser etch conditions for each particular film, such as the laser output power, pulse frequency, etc.

The back film electrode 4a, 4b, 4c, —formed on each N-type layer of the respective photo-active layer 3a, 3b, 3, —is selected from well known metals such as aluminum, titanium, gold, silver, etc which make ohmic contact with the aforementioned N-type layer. Aluminum, however, is particularly advantageous for the following reasons. That is, when using aluminum, it is not only possible to reflect the light which penetrates through the N-type layer mentioned above, and the I-type (non-doped) layer contributing to the photoelectric conversion, but it also is low in cost. On the other hand, depending on the kind of laser to be used, since aluminum has a high reflection factor for ordinary laser beams, for example, more than approximately 90% for the YAG laser having a wave length of 1.06 $\mu$m, and a good heat conductivity, patterning by the laser beam without causing thermal damage to the exposed portions 2a', 2b', 2c', —of the transparent film electrodes 2a, 2b, 2c, —is difficult. Also in the U.S. patent cited above, in the embodiment using aluminum as the back film electrode material, a method of direct pattern forming without laser processing is employed by vapor depositing of aluminum from a diagonal direction onto the photoactive layer 3a, 3b, 3c, —and the transparent film elctrodes 2a, 2b, 2c, —where the laser patterning has been previously made.

Furthermore, a difficulty which tends to occur in thermal processing by irradiation of a laser beam is that, an unremoved "hanging" edge 7 of the back electrode film is the adjacent spacing portion 6 remains as shown in FIG. 2, because of the good heat conductivity of the back film electrode 4b made of the ohmic metal. When this "hanging" of the edge 7 takes place, since the exposed portion 2b' of the transparent film electrode 2b of the associated photoelectric converting region 5b is present thereunder, the photoelectric converting region 5b will be electrically short circuited by the contact therebetween.

Further care must be taken so that, as shown in FIG. 3, in the construction wherein the back film electrodes 4a, 4b, 4c, —are separated on the photo-active layers 3a, 3b, 3c, —the back electrodes 4a, 4b, 4c which shoud be physically separated via a portion 3' of the photo-active layer are not connected electrically due to the portion 3' of the photoactive layer being hit directly by the laser beam, causing annealing and lowering the resistance thereof.

SUMMARY OF THE INVENTION

A principal object of the present invention is, therefore, to provide a photovoltaic device having a novel construction and being capable of avoiding thermal damage to a lower layer even when patterning by an energy beam is utilized.

It is another object of the present invention to provide a photovoltaic device having a construction which is capable of eliminating the possibility of short circuits between the first and second electrodes in the photoelectric converting regions.

The present invention is a photovoltaic device comprising a substrate having an insulating surface, a plurality of first film electrodes formed on the insulating surface of the substrate and spaced apart from each other, a plurality of photo-active layers formed on the respective first film electrodes so as to expose a portion of the first film electrode thereunder, insulating adiabatic layers formed on the first film electrodes, and second film electrodes formed on the photo-active layers and connected to the adjacent first film electrodes.

According to the present invention, the insulating adiabatic layer disposed on the first film electrode is extremely useful in the production process of the photovoltaic device. More particularly, even during laser beam irradiation in the forming of the individual second film electrodes, since the thermal energy thereof is interrupted by the insulating adiabatic layer, thermal damage to the first film electrode thereunder will be prevented. Moreover, even when the fused edge of the second film electrode hangs down as shown in FIG. 2, since the insulating adiabatic layer is between that portion and the first film electrode as shown in FIG. 11, these two electrodes will never contact each other, and thus short circuiting of the photoelectric converting region is completely prevented.

In a certain embodiment of the present invention, the insulating adiabatic layer is formed under the photo-active layer in a thickness greater than that of the photo-active layer. According to this embodiment, since the insulating adiabatic layer is thick, the photo-active layer formed thereon can be completely separated by the irradiation of the energy beam; accordingly electrical conduction between adjacent second film elctrodes through the annealed photoactive layer is completely prevented.

When the insulating adiabatic layer is formed of a light transmissive material, the spacing portion between adjacent photoelectric converting regions may be formed by irradiating the laser beam from the rear side of the substrate.

These objects and other objects, features, aspects, and advantages of the present invention will become more apparent from the following detailed description of the embodiment when taken in connection with the accompanying drawings.

DESCRIPTION OF THE PREFERRED EMBODIMENTS

Figure 1:
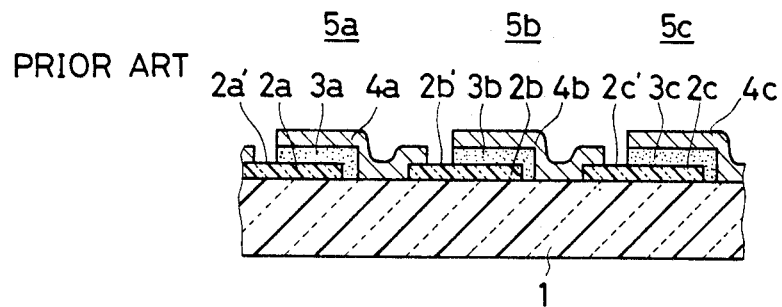
FIG. 1 is a cross-sectional view of a conventional prior art photovoltaic device.
Figure 2:
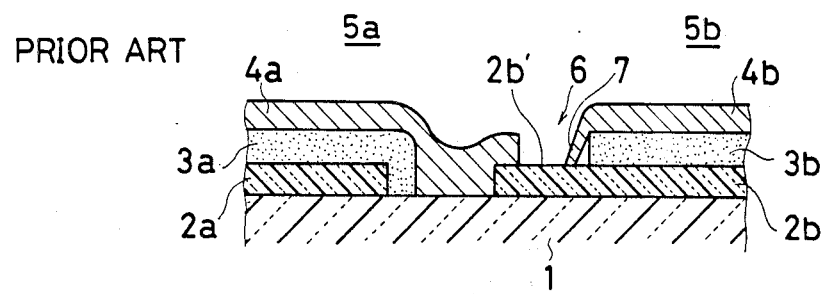
FIG. 2 is a partial cross-sectional view showing defects of the prior art.
Figure 3:
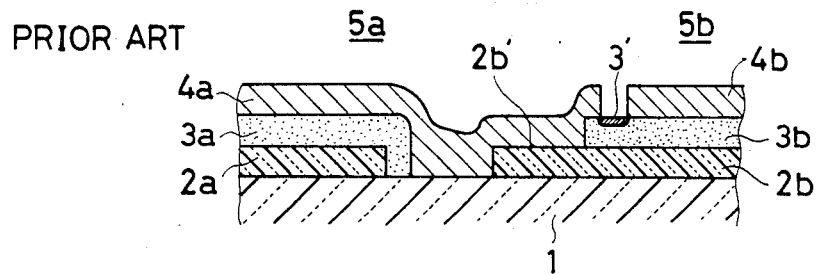
FIG. 3 is another partial cross-sectional view showing defects of the prior art.
Figure 4:
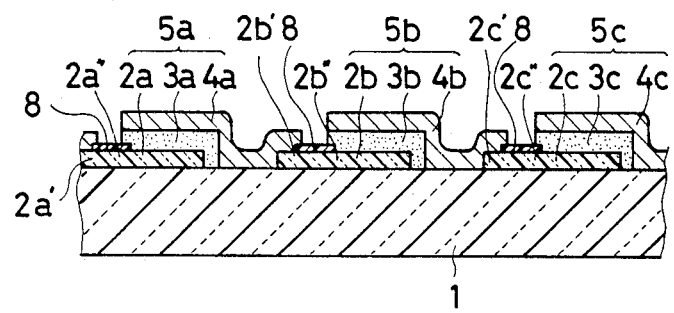
FIG. 4 is a cross-sectional view showing one embodiment of the present invention.

FIG. 4 is a cross-sectional view showing one embodiment of the present invention. In FIG. 4, the same reference characters denote like parts and similar parts as the prior art device shown in FIG. 1 and a duplicate description thereof will be omitted.

The embodiment is characterized by insulating adiabatic layers 8, 8, 8, —consisting, for example, of $SiO_2$ or the like are disposed extending from the left edge of each photo-active layer 3a, 3b, 3c, —for covering exposed surfaces 2a'', 2b'', 2c'', —of exposed portions 2a', 2b', 2c', —of transparent film electrodes 2a, 2b, 2c, —. Such insulating layers 8, 8, 8, —serve as adiabatic layers when irradiating a laser beam for dividing the back electrode film 4 into each separate rear electrodes 4a, 4b, 4c, —, after the back electrode film 4 is deposited continuously over the photo-active layers 3a, 3b, 3c, —, the exposed portions 2a', 2b', 2c', —and the insulating adiabatic layers 8, 8, 8, —.

Figure 5:
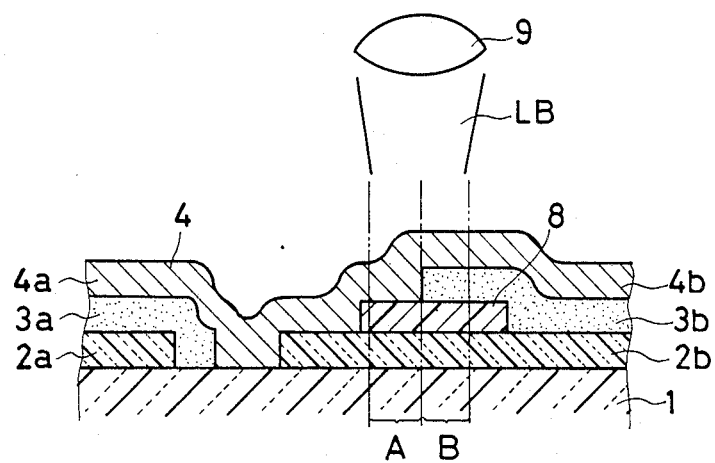
FIG. 5 is a cross-sectional view for explaining the production process of the embodiment of FIG. 4.
Figure 6:
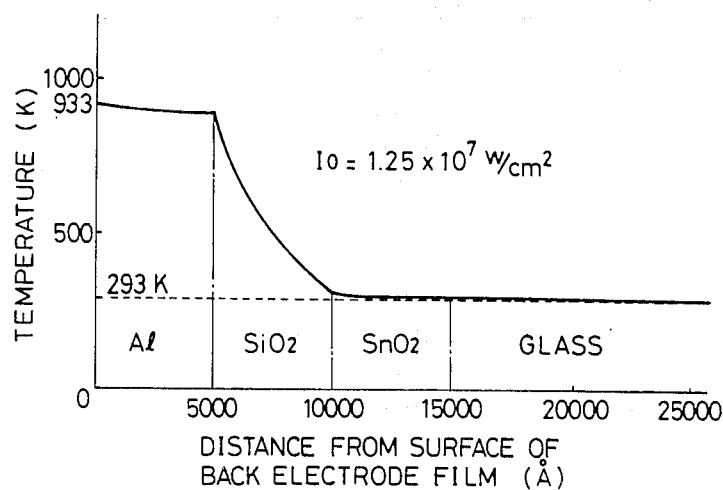
FIGS. 6 and 8 are graphs explaining the temperature gradient in the process of FIG. 5.
Figure 7:
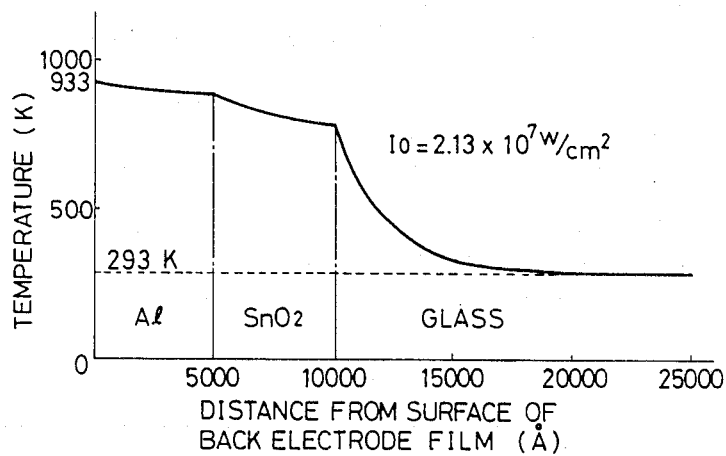
FIGS. 7 and 9 are graphs explaining the temperature gradient in the prior art.
Figure 8:
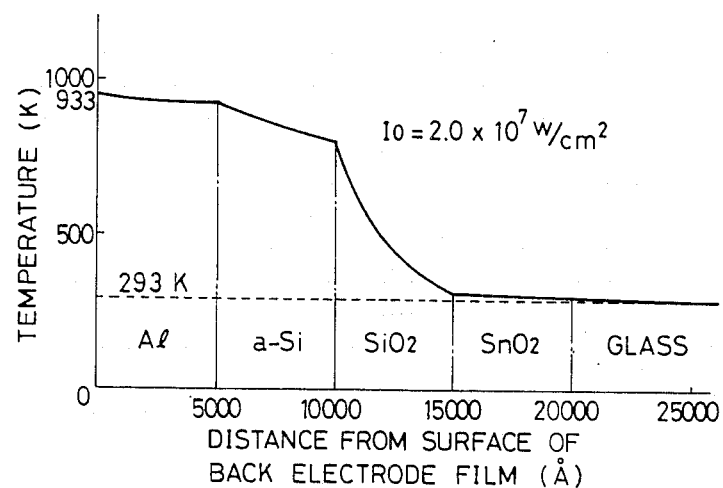
Figure 9:
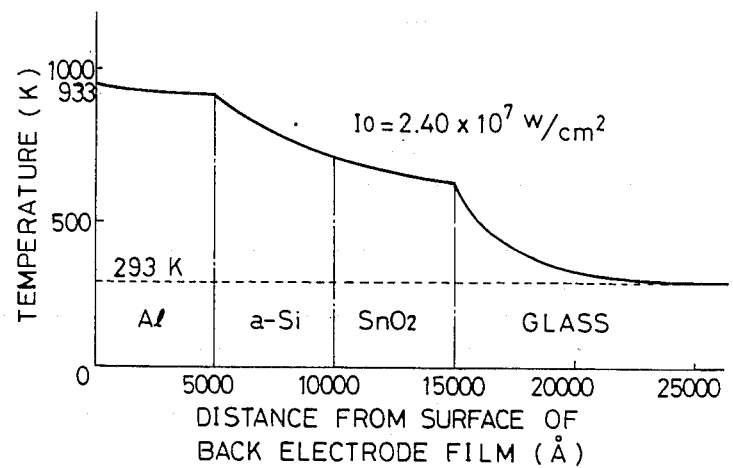

FIG. 5 shows an irradiating process of the laser beam LB after the continuous back electrode film 4 described above has been deposited. The objective lens 9 is for adjusting the beam diameter of the laser beam LB, and the laser beam LB focused by the objective lens 9 is scanned so as to irradiate regions A and B defined by the single dotted lines. Referring to FIG. 5 and FIGS. 6 to 9 showing temperature distribution charts, the function of the insulating adiabatic layers 8, 8, 8, —during the irradiation of the laser beam LB will be described. From the exposed surface side of the back electrode film 4 to which the laser beam LB is incident, the back electrode film 4, the insulating adiabatic layer 8, the transparent film electrode 2b and the substrate 1 are arranged in that order in the irradiation region A, while in the irradiation region B, the back electrode film 4, the photo-active layer 3b, the insulating adiabatic layer 8, the transparent film electrode 2b, and the substrate 1 are arranged in that order. In the embodiment shown, aluminum (Al) or aluminum alloy, amorphous silicon (a-Si), silicon dioxide ($SiO_2$), tin oxide ($SnO_2$), and glass are used respectively as the back electrode film 4, the photo-active layer 3b, the insulating adiabatic layer 8, the transparent film electrode 2a, and the substrate 1. The thickness of each film except the glass substrate 1 is approximately 5000 Å. As the laser device, a Q switched Nd:YAG laser having a wave length of 1.06 $\mu$m and a pulse width of 100 nsec. was used. The reflection factor of aluminum relative to such a YAG laser is about 92% and the output Io of the laser beam was controlled so as to bring the temperature at the exposed surface of the Al forming the back electrode film 4 to 933° K., which is the melting point of Al. FIGS. 6 and 7 show the temperature distributions in the irradiation region A, wherein FIG. 6 is for the embodiment shown in FIG. 4 and FIG. 7 is for the conventional example shown in FIG. 1, in which the insulating adiabatic layer 8 of $SiO_2$ is not present. FIGS. 8 and 9 are the temperature distributions in the irradiation region B, wherein FIG. 8 is for the inventive embodiment, while FIG. 9 is for the conventional example.

From the temperature distributions in FIGS. 6 through 9, it will be understood that, in the embodiment of the present invention wherein the insulating adiabatic layer 8 of $SiO_2$ is arranged in the interface between the back electrode film 4 of Al and the transparent electrode film 2b of $SnO_2$ or between the photo-active layer 3b of a-Si and the transparent electrode film 2b of $SnO_2$, the surface temperature of the transparent film electrode 2b remains generally equal to the room temperature of 293° K. and the insulating adiabatic layer 8 exhibits a considerably large adiabatic action.

Meanwhile, as shown in FIGS. 6 through 9, the laser beam output Io for raising the temperature of the exposed Al surface uniformly to 933° K. is advantageously smaller when the insulating adiabatic layer 8 is interposed as in the present invention, since heat conduction to the lower transparent film electrode 2b is interrupted due to the adiabatic action of the insulating adiabatic layer 8. This means that the patterning of the second film electrode may be accomplished by a low power laser when the insulating adiabatic layer 8 is included as in the present invention.

The insulating adiabatic layer 8 described above may consist of $Si_3N_4$, $Al_2O_3$, PSG, BSG, etc, besides $SiO_2$, and may be formed by thermal oxidation (nitriding), various CVD methods, and sputtering methods well known to those skilled in the art. Particularly, in the case of $SiO_2$ and $Si_3N_4$, the laser CVD method is preferred. More particularly, raw material gases such as silane ($SiH_4$) and oxygen ($O_2$) or nitrogen ($N_2$), ammonia ($NH_3$), nitrous oxide ($N_2O$), etc are fed into a chamber, and are thermally excited when a laser beam having a wave length in the ultraviolet region, for example, 193 nm, is irradiated only at positions where the insulating adiabatic layer 8 is to be formed, and a $SiO_2$ film or a $Si_3N_4$ film is formed directly thereat. The laser CVD method has been disclosed by P. K. Boyer in "Laser-induced Chemical Vapor Deposition of $SiO_2$" Appl. Phys, Lett. 40 (8) PP716–718 (1982) and is well known.

Furthermore, a preferred forming method for the insulating adiabatic layer 8 in addition to the laser CVD method, is the plasma CVD method. More particularly, the raw material gas mentioned above is fed into a glow-discharge apparatus and the portions of the substrate 1 where the insulating adiabatic layer 8 is not deposited are covered by a mask, and then the substrate 1 is placed inside the glow-discharge apparatus mentioned above and the glow-discharge is excited. According to the method, the raw material gas is decomposed by the plasma and the insulating adiabatic layer of $SiO_2$ or $Si_3N_4$ can be readily formed selectively through the mask.

Such an insulating adiabatic layer 8 of $SiO_2$, $Si_3N_4$ etc is formed after forming the transparent film electrode 2a, 2b, 2c, —of each photoelectric converting region 5a, 5b, 5c, —on the substrate 1, prior to forming of each photoactive layer 3a, 3b, 3c, —. After forming the insulating adiabatic layers 8, 8, 8, —, the photo-active layer having at least one junction is formed continuously covering the transparent film electrodes 2a, 2b, 2c, —and the insulating adiabatic layers 8, 8, 8, —.

The series of photo-active layers is divided into the photo-active layers 3a, 3b, 3c, —of each photoelectric converting region 5a, 5b, 5c, —by irradiation of the laser beam, the exposed portions 2a', 2b', 2c', —of the transparent film electrodes 2a, 2b, 2c, —and the insulating adiabatic layers 8, 8, 8, —being exposed from the adjacent interfaces thereof.

Thereafter, the back electrode film 4 is deposited by vapor deposition, continuously covering the photo-active layers 3a, 3b, 3c, —the insulating adiabatic layers 8, 8, 8, —and the exposed portions 2a', 2b', 2c', —of the transparent film electrodes 2a, 2b, 2c, —. FIG. 5 shows the patterning process by the laser beam of the back electrode film 4 formed by vapor deposition in such a manner.

As described above, on the transparent film electrodes 2a, 2b, 2c, —in the irradiation regions A and B, there are provided the insulating adiabatic layers 8, 8, 8, —, which exhibit an adiabatic function against the heat caused by the laser beam, Accordingly, even when aluminum or aluminum alloy having a poor selective processibility by the laser beam is used as the back electrode film 4, the transparent film electrodes 2a, 2b, 2c, —will not suffer thermal damage, since they are covered by the insulating adiabatic layers 8, 8, 8, —mentioned above, and less laser beam power is required to fuse the back electrode film. According to the present invention, the back electrode film of aluminum or aluminum alloy can therefore be patterned precisely by the laser beam. This holds for the other ohmic metals, and since a fairly large laser output power is applicable, the processing conditions are considerably eased and the selective processing of the second film electrode may be simplified.

Figure 10:
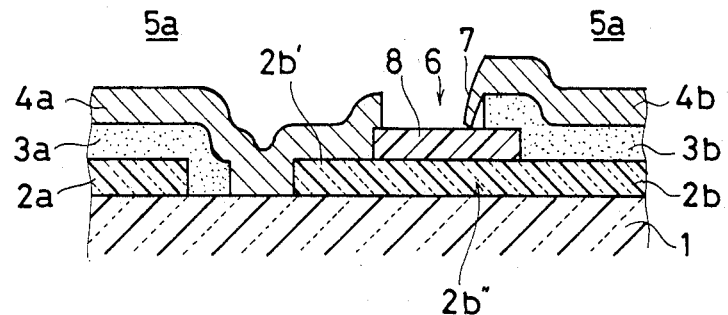
FIG. 10 is a cross-sectional view showing a stage in the processing of the previous embodiment of the present invention.

FIG. 10 shows the state of the back electrode film after the patterning by the laser beam. As described above, the insulating adiabatic layers 8, 8, 8, —serve as an adiabatic body for reducing thermal damage to the lower layer from irradiating the laser beam. The insulating adiabatic layers 8, 8, 8, —also serve as an insulator for preventing short circuits due to contact between the hanging edge 7 of the back film electrode 4b and the transparent film electrode 2b in the associated photoelectric converting region 5b.

Figure 11:
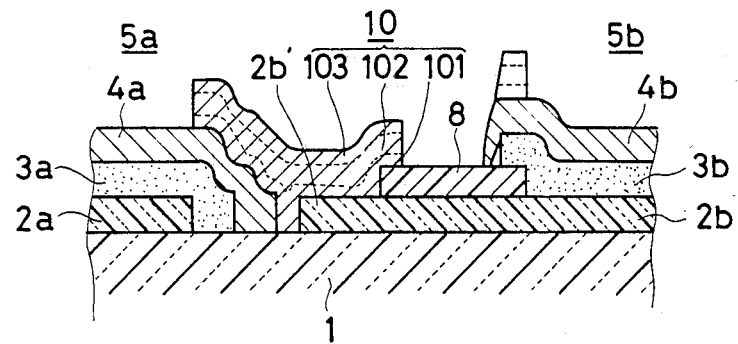
FIG. 11 is a cross-sectional view showing another embodiment of the present invention.

FIG. 11 is a cross-sectional view showing another embodiment of the present invention. What differs from the previous embodiment in the embodiment is the manner of connecting the adjacent photoelectric converting regions 5a, 5b, 5c, —in series. That is, in the embodiment, the back film electrode 4a is not connected directly to the exposed in the photoelectric converting region 5b on the right side, but is indirectly connected to the transparent film electrode 2b by means of a connecting film electrode 10 having a triple layer construction. Accordingly, in the embodiment, the connecting film electrode 10 serves substantially as an electrically extending portion of the back film electrode 4a.

The connecting electrode film 10 mentioned above is a triple layer construction, formed in order from the side of the transparent film electrode 2b, of titanium (Ti) or titanium silver (TiAg), Al or Al alloy, and Ti or TiAg. The titanium or the titanium silver in lower layer 101 protects the intermediate layer 102 consisting of Al or the Al alloy. The aluminum or aluminum alloy is used as an intermediate layer 102 because it is indispensable for reducing series resistance. The titanium or the titanium silver in the lower layer 101 prevents oxidation of the aluminum into $Al_2O_3$ of high resistance, which may occure at the interface when it is directly bonded with the transparent film electrode 2b consisting of transparent conductive oxide (TCO) such as $SnO_2$, ITO, etc, and corrosion by the other causes. The titanium or the titanium-silver of upper layer 103 is a moisture-proof film for the aluminum or the aluminum alloy in the intermediate layer 102.

Figure 12:
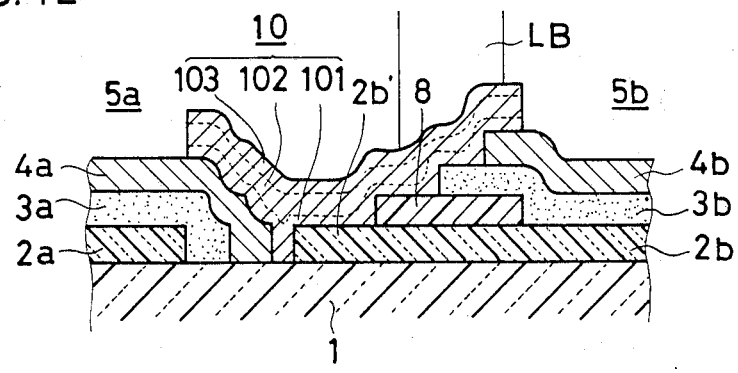
FIG. 12 is a partial cross-sectional view for explaining a production process in the embodiment of FIG. 11.

Furthermore, the back film electrode 4a in the embodiment of FIG. 12 is of Al or Al alloy. When the back film electrode 4a is patterned by the irradiation of the laser beam as in the previous embodiment, since the exposed portion 2b' of the transparent film electrode 2b will be exposed to irradiation by the laser beam, the forming of the back electrode film is performed by a selective vapor deposition method covering the unwanted portions by a mask. Even when forming the back film electrode 4a by the selective vapor deposition method, the adjacent spacing portion is not needed to be any wider than necessary. This is because the exposed length of the transparent film electrode 2b must have a dimension longer than a certain length for reducing the series resistance and the connecting film electrode 10 which is next deposited is patterned by the irradiation of the laser beam LB as in FIG. 12.

Figure 13:
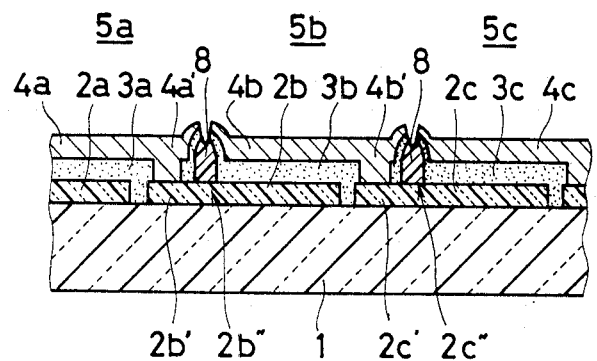
FIG. 13 is a cross-sectional view showing a further embodiment of the present invention.

FIG. 13 is a cross-sectional view showing another embodiment of the present invention. In FIG. 13, the same reference characters denote like parts or similar parts in the embodiment of FIG. 4, and duplicate description thereof will be omitted.

In the embodiment, insulating adiabatic layers 8, 8, —of stripe-shape having a film thickness sufficiently thicker than the photo-active layers 3a, 3b, 3c, —are formed prior to formation of the latter. The electrically extending portions 4a', 4b', —of the back film electrodes 4a, 4b, —overlaying the adiabatic stripes 8, 8 —, are removed by irradiation of the laser beam and divided into back film electrodes 4a, 4b, —. Accordingly, in each adjacent spacing portion, the exposed portions 2b', 2c', —of the transparent film electrodes 2b, 2c, —of the photoelectric converting regions 5b, 5c, —on the right side and the extending portions 4a', 4b', —of the back film electrodes 4a, 4b, —of the photoelectric converting regions 5a, 5b, —on the left side are respectively connected electrically in series.

As in the previous embodiment, the insulating adiabatic stripes 8, 8, —are made of materials which do not diffuse in to the photo-active layers 3a, 3b, 3c, —being formed in a later step. For example, metal oxides such as ruthenium oxide, alumina, silicon dioxide, and other inorganic materials are useful. Then, when forming insulating adiabatic stripes having a greater film thickness than in the previous embodiment, a relatively simple technique such as a screen printing, etc may be utilized. More particularly, on the predetermined positions of the transparent film electrodes 2a, 2b, 2c, —the insulating adiabatic stripes 8, 8, —are deposited by screen printing at a thickness of 5 to 20 μm and a width of 50 to 200 μm and baked thereafter. The thickness of the photo-active layers 3a, 3b, 3c, —is normally about 5000 Å, while the insulating adiabatic stripes 8, 8, —are thicker than that.

Figure 14:
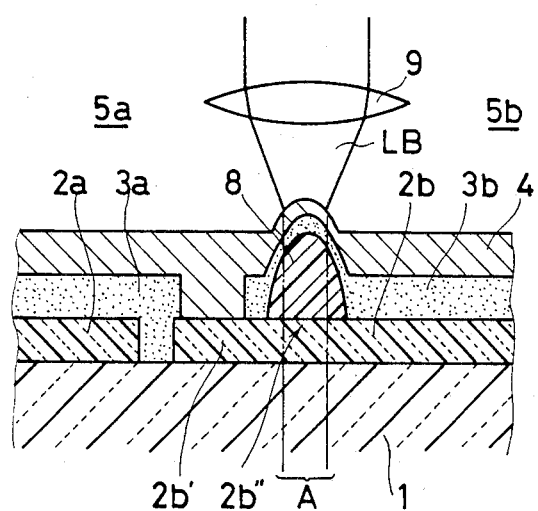
FIG. 14 is a partial cross-sectional view for explaining an irradiating process of a laser beam in the embodiment of FIG. 13.

FIG. 14 shows the laser beam irradiating process wherein the back film electrode 4 deposited by vapor deposition is divided. In the example, the laser beam of predetermined power output is focused by the objective lens 9 and scanned for irradiating the region A defined by the single dotted lines. Since the insulating adiabatic stripes 8, 8, —disposed on the portions 2b'', 2c'', —of the transparent film electrode in the irradiation regions A described above have a thickness sufficiently thicker than the other constituted layers, they will not be burnt off even the output power of the laser beam LB is greater than required, thus serving as an adiabatic body against the heat caused by the irradiation of the laser beam LB.

Meanwhile, since the width of the insulating adiabatic stripes 8, 8, —is approximately 50 to 200 μm, the protrusion thereof is not so extreme as illustrated exaggeratively in FIG. 13, and the area loss caused thereby is not large.

Figure 15:
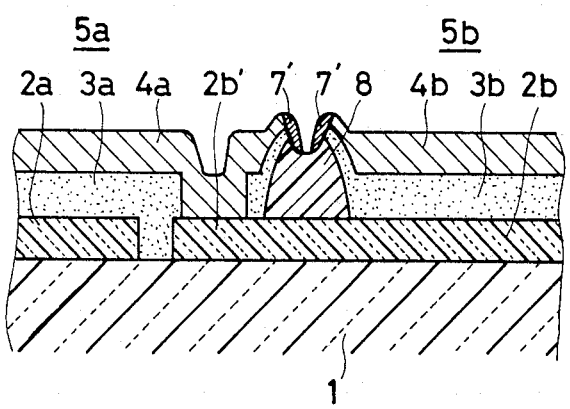
FIG. 15 is a cross-sectional view showing the state after the process of FIG. 14.

FIG. 15 shows the state of the back electrode film after the laser patterning. The insulating adiabatic stripes 8, 8, —serve as an insulator for preventing short circuits due to contact between the associated photoelectric converting region 5b and the transparent film electrode 2b by a fused mixture 7' of the back film electrode 4b and the photo-active layer 3b, after the patterning of the second film electrode.

Figure 16:
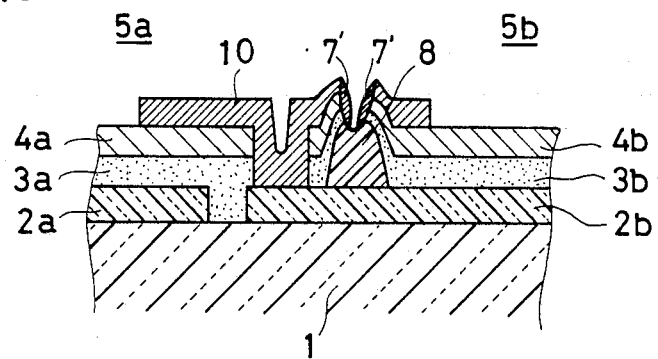
FIG. 16 is a cross-sectional view showing still another embodiment of the present invention.

FIG. 16 is a cross-sectional view showing another embodiment of the present invention. In this embodiment, as in the embodiment of FIG. 12, connecting electrodes 10, 10, —having a triple layer construction are used.

If the insulating adiabatic layers 8, 8, —are disposed under the photo-active layer 3a, 3b, 3c, —as in the embodiments shown in FIGS. 13 through 16, even when the photo-active layers are in the continuous unsegmented state, since they are divided by the portions of the insulating adiabatic layer, selective processing of the photo-active layer is not necessary. In other words, since the photoactive layer and the second electrode film can be patterned simultaneously, the process may be simplified.

Meanwhile, in the embodiments shown in FIGS. 12 and 16, the back film electrode of Al or Al alloy may be covered entirely by the connecting electrode film 10 having a metal such as Ti or TiAg with a high moisture resistance on the upper layer.

Furthermore, in the embodiments described above, insulating adiabatic layers 8, 8, —were used. However, a simple adiabatic material may be used just for preventing the thermal damage to the lower first film electrode by the irradiation of the laser beam and a simple insulator may be used just for preventing the short circuits caused by the fusion of the second film electrode.

Figure 17:
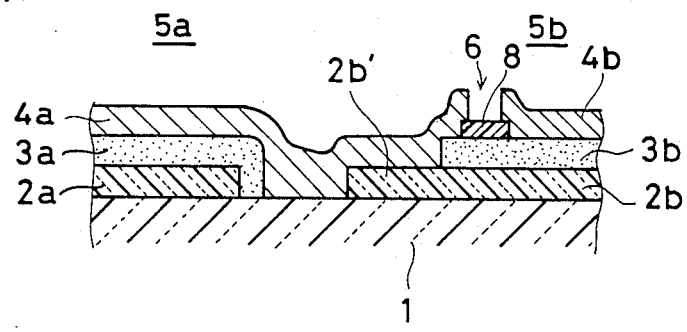
FIG. 17 is a cross-sectional view showing yet another embodiment of the present invention.

FIG. 17 is a cross-sectional view showing another embodiment of the present invention. In the embodiment shown, the insulating adiabatic layer 8 is arranged on the photo-active layer 3b different from the previous embodiments where the insulating adiabatic layer 8 is formed on the transparent film electrode 2b. According to the embodiment, thermal damage to the transparent film electrode and the photo-active layer due to the energy beam is prevented by the insulating adiabatic layer 8.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. A photovoltaic device comprising:
   a substrate having an insulating surface,
   a plurality of first film electrodes formed in spaced relationship on said insulating surface of said substrate to define a plurality of photoelectric converting regions,
   a corresponding plurality of photo-active layers each formed on a respective one of said first film electrodes so as to expose a portion thereof,
   a corresponding plurality of insulating adiabatic layers each formed on part of the exposed portion of said first film electrodes in the spaces between adjacent photoelectric converting regions, said adiabatic layers being constructed to shield at least one underlying layer against thermal damage by an energy beam of the type utilized in scribing semiconductor devices, and a corresponding plurality of second film electrodes formed on said photo-active layers, each connected directly or indirectly to the first film electrodes of adjacent photoelectric converting regions and separated from one of said adjacent photoelectric converting regions by said insulating adiabatic layer.

2. A photovoltaic device in accordance with claim 1, wherein said insulating adiabatic layer is a thin film.

3. A photovoltaic device in accordance with claim 2, wherein said insulating adiabatic layer is constituted by a light transmissive material.

4. A photovoltaic device in accordance with claim 1, wherein said insulating adiabatic layer includes a portion having a thickness thicker than said photo-active layer.

5. A photovoltaic device in accordance with claim 1, wherein said insulating adiabatic layer includes inorganic compounds.

6. A photovoltaic device in accordance with claim 5, wherein said inorganic compounds include oxides.

7. A photovoltaic device in accordance with claim 5, wherein said inorganic compounds include nitrides.

8. A photovoltaic device in accordance with claim 1, wherein said second film electrode includes aluminum or aluminum alloy.

9. A photovoltaic device in accordance with claim 8, which further comprises a connecting electrode consisting of a not easily oxidizable metal material, formed on said second film electrode for connecting said first film electrode in the adjacent photoelectric converting region and said second film electrode.

10. A photovoltaic device in accordance with claim 1, wherein said insulating adiabatic layer is formed on a portion of said first film electrode not covered by said photo-active layer.

11. A photovoltaic device in accordance with claim 1, wherein said insulating adiabatic layer is formed under portions of said photoactive layers.

12. A photovoltaic device comprising:

a substrate having an insulating surface, a plurality of first film electrodes formed in spaced relationship on said insulating surface of said substrate to define a plurality of photoelectric converting regions, a corresponding plurality of photo-active layers each formed on a respective one of said first film electrodes so as to expose a portion thereof, a corresponding plurality of adiabatic layers each formed on said first film electrodes in the spaces between adjacent photoelectric converting regions, said adiabatic layers being constructed to shield at least one underlying layer against thermal damage by an energy beam of the type utilized in scribing semiconductor devices, and a corresponding plurality of second film electrodes formed on said photo-active layers, each connected directly or indirectly to the first film electrodes of adjacent photoelectric converting regions and separated from one of said adjacent photoelectric converting regions by said adiabatic layer.

13. A photovoltaic device comprising:

a substrate having an insulating surface, a plurality of first film electrodes formed in spaced relationship on said insulating surface of said substrate to define a plurality of photoelectric converting regions, a corresponding plurality of photo-active layers each formed on a respective one of said first film electrodes, so as to expose a portion thereof, a corresponding plurality of insulating adiabatic layers each formed on part of respective portions of said photoactive layers, said adiabatic layers being constructed to shield an underlying layer against thermal damage by an energy beam of the type utilized in scribing semiconductor devices, and a corresponding plurality of second film electrodes formed on said photo-active layers and in contact with at least a portion of the top surface of a corresponding adiabatic layer, each connected directly or indirectly to the first film electrodes of adjacent photoelectric converting regions and separated from one of said adjacent photoelectric converting regions by said insulating adiabatic layer.

* * * * *